United States Patent
Shevchenko et al.

(10) Patent No.: US 11,725,275 B2
(45) Date of Patent: Aug. 15, 2023

(54) LOW REFRACTIVE INDEX SURFACE LAYERS AND RELATED METHODS

(71) Applicant: UCHICAGO ARGONNE, LLC, Chicago, IL (US)

(72) Inventors: Elena Shevchenko, Riverside, IL (US); Diana Berman, Lemont, IL (US); Supratik Guha, Lemont, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 15/649,448

(22) Filed: Jul. 13, 2017

(65) Prior Publication Data
US 2019/0017166 A1  Jan. 17, 2019

(51) Int. Cl.
*C23C 16/40* (2006.01)
*C23C 16/455* (2006.01)
*C23C 16/56* (2006.01)
*G02B 1/111* (2015.01)
*C23C 16/04* (2006.01)
*G02B 1/118* (2015.01)

(52) U.S. Cl.
CPC .............. *C23C 16/40* (2013.01); *C23C 16/04* (2013.01); *C23C 16/045* (2013.01); *C23C 16/403* (2013.01); *C23C 16/405* (2013.01); *C23C 16/45525* (2013.01); *C23C 16/45527* (2013.01); *C23C 16/45555* (2013.01); *C23C 16/56* (2013.01); *G02B 1/111* (2013.01); *G02B 1/118* (2013.01); *G02B 2207/107* (2013.01)

(58) Field of Classification Search
CPC ... C23C 16/40; C23C 16/45527; C23C 16/56; G02B 1/111
USPC .................................................. 427/162–169
See application file for complete search history.

(56) References Cited

U.S. PATENT DOCUMENTS 5,811,191 A * 9/1998 Neuman ............. C03C 17/3417
428/427
6,506,090 B2 * 1/2003 Kotsubo ................... G09F 9/33
445/49
(Continued)

FOREIGN PATENT DOCUMENTS

WO    WO-2015053828 A2 *  4/2015 ............. B82Y 30/00

OTHER PUBLICATIONS

Murov (https://web.archive.org/web/20101112022912/http://murov.info/orgsolvents.htm accessed online Nov. 25, 2019) (Year: 2010).*
(Continued)

*Primary Examiner* — Michael B Cleveland
*Assistant Examiner* — Michael G Miller
(74) *Attorney, Agent, or Firm* — Marshall, Gerstein & Borun LLP

(57) ABSTRACT

The disclosure relates to a method for forming a low refractive index layer on a substrate. The method generally includes (a) applying a block copolymer layer on a substrate, the block copolymer including a polar polymeric block and a non-polar polymeric block; (b) swelling the block copolymer layer with a solvent to increase the block copolymer layer thickness; (c) depositing a metal oxide or metalloid oxide layer on polar polymeric blocks of the block copolymer layer; and (d) removing the block copolymer layer from the substrate, thereby forming a porous metal oxide or metalloid oxide layer on the substrate.

30 Claims, 1 Drawing Sheet

(56) References Cited

U.S. PATENT DOCUMENTS

| | | | |
|---|---|---|---|
| 8,551,808 B2 | 10/2013 | Marsh et al. | |
| 2010/0102415 A1* | 4/2010 | Millward | B82Y 10/00 257/506 |
| 2012/0046421 A1* | 2/2012 | Darling | C08F 8/42 525/371 |
| 2012/0202017 A1* | 8/2012 | Nealey | B81C 1/00031 428/195.1 |
| 2014/0335366 A1* | 11/2014 | de Oliveira | C09D 5/006 428/447 |
| 2016/0282532 A1* | 9/2016 | Le | C23C 14/30 |

OTHER PUBLICATIONS

Aluminum Oxide, https://refractiveindex.info/?shelf=main&book=Al2O3&page=Malitson-o (Year: 2021).*

Zinc Oxide, https://refractiveindex.info/?shelf=main&book=ZnO&page=Bond-o (Year: 2021).*

Berman et al., Sequenctial infiltration synthesis for the design of low refractive index surface coatings with controllable thickness, ACS Nano, 11(3):2521-2530 (Mar. 2017).

Biswas et al., New Insight into the Mechanism of Sequential Infiltration Synthesis from Infrared Spectroscopy, Chem. Mater., 26(21):6135-41 (2014).

Li et al., A facile layer-by-layer deposition process for the fabrication of highly transparent superhydrophobic coatings, Chem. Commun. (Camb), (19):2730-2 (May 2009).

Peng et al., A route to nanoscopic materials via sequential infiltration synthesis on block copolymer templates, ACS Nano, 5(6):4600-6 (Jun. 2011).

Peng et al., Nanoscopic patterned materials with tunable dimensions via atomic layer deposition on block copolymers, Adv. Mater., 22(45):5129-33 (Dec. 2010).

Shevchenko, Antireflective Coatings, Argonne National Laboratory (Oct. 2016).

Wang, Anti-Reflective Coating on PV Cover Glass, presentation, DSM (Koninklijke DSM N.V.) (Oct. 21, 2014).

Wang, Nondestructive Creation of Ordered Nanopores by Selective Swelling of Block Copolymers: Toward Homoporous Membranes, Acc. Chem. Res., 49(7):1401-8 (Jul. 2016).

Wicht et al., Nanoporous films with low refractive index for large-surface broad-band anti-reflection coatings, Macromol. Mater. Eng. MME, (2010).

Yin et al., Membranes with highly ordered straight nanopores by selective swelling of fast perpendicularly aligned block copolymers, ACS Nano, 7(11):9961-7 (Nov. 2013).

* cited by examiner

LOW REFRACTIVE INDEX SURFACE LAYERS AND RELATED METHODS

STATEMENT OF GOVERNMENT SUPPORT

This invention was made with government support under contract number DE-AC02-06CH11357 awarded by the U.S. Department of Energy. The government has certain rights in the invention.

FIELD OF THE DISCLOSURE

The disclosure relates generally to a method for forming a low refractive index layer or coating on a substrate and substrates having low refractive index layers thereon. More particularly, the disclosure relates to sequential infiltration synthesis of single and multi-layered low refractive index layers on a substrate.

BACKGROUND

Controlling the refractive index of a surface coating is highly desirable for a broad range of applications ranging from high performance computing to antireflective coating (ARC) of corrective lenses. Coatings with low refractive indices improve the performance of light emitting diodes, solar cells, and eye glasses. The reduction of light reflected off surfaces depends on adjusting both the thickness and refractive index of the ARC in a way that the light reflected off two interfaces, such as air/coating and coating/substrate, interferes destructively. The refractive index of optical materials can be lowered by inducing suboptical porosity. For example, the refractive index of bulk silica is 1.46; however, nanoporous silica films with refractive index of 1.08 have been prepared.

In general, the tuning of the refractive index of ARCs is a labor-intensive process, both in physical and chemical approaches. Lithographic and physical methods can produce ARCs with finely tuned refractive indices, resulting in excellent optical performance; however, this is achieved at the expense of high cost. In turn, the cost of chemically fabricated ARCs is reasonable; however, their performance is somewhat compromised, mainly because of the inability to finely control the refractive index. Design of multilayered ARCs by chemical methods, such as sol-gels, dipping or spinning processes, is challenging since each layer requires thermal annealing that can alter the porosity in the previously deposited layers, affecting their optical properties. Also, chemical methods based on etching are not well suited to fabricate gradient structures due to potential impact of the etching agents on structures fabricated in the previous steps. However, the biggest challenge for ARCs on surfaces with low refractive indices is that regardless of the fabrication method, state-of-the-art graded-index ARCs on surfaces with low refractive indices assume the initial deposition of coatings with high refractive indices. This step of artificial increase of refractive index of the surface is needed as there are only a limited number of materials with a refractive index of less than about 1.5, the refractive index of materials of interest for corrective lenses, telescopes, and flat-panel displays, such as fused glass (1.458), crown glass (1.485), and alkali-aluminosilicate plate glass (1.5).

One approach for controlling the refractive index of a surface coating uses sequential infiltration synthesis (SIS), which involves providing a substrate coated with a polymer template, assembling an inorganic phase at a polymer template, and removing the polymer matrix by thermal annealing.

In SIS, the thickness of the deposited coating is determined by the diffusion of the inorganic phase in a given polymer template. Therefore, an increase in the thickness of the polymer template does not correlate to the formation of a thicker inorganic coating. Additionally, the use of block copolymers having a polar domain and a non-polar domain allows for control of the area of the deposited inorganic material. In particular, the inorganic phase infiltrates only one of the polar or the non-polar domains of the block copolymer. The presence of the other domain (i.e., the domain that is not infiltrated with inorganic material), results in porous layers of inorganic material on the substrate.

SUMMARY

One aspect of the disclosure provides a method for forming a low refractive index layer or coating on a substrate, the method comprising (a) applying a block copolymer layer on a substrate, the block copolymer comprising a polar polymeric block and a non-polar polymeric block, (b) swelling the block copolymer layer with a solvent to increase the block copolymer layer thickness, (c) depositing a metal oxide or metalloid oxide layer on polar polymeric blocks of the block copolymer layer, and (d) removing the block copolymer layer from the substrate, thereby forming a porous metal oxide or metalloid oxide layer on the substrate.

Another aspect of the disclosure provides an antireflective coated substrate comprising (a) a transparent material substrate, and (b) a porous metal oxide or metalloid oxide layer on the transparent material substrate, wherein the porous metal oxide or metalloid oxide layer has an index of refraction ($n_c$) and a thickness ($d_c$) selected according to the following relationship:

$$n_c = (n_s n_m)^{0.5} \quad (I)$$

$$d_c = \lambda_0/(4n_c) \quad (II)$$

wherein $n_s$ is the index of refraction of the transparent material of the substrate, $n_m$ is the index of refraction of the medium through which incident light passes before passing through the formed porous metal oxide or metalloid oxide layer and the transparent material of the substrate, $\lambda_0$ is an incident wavelength to be fully transmitted through the porous metal oxide or metalloid oxide layer and the transparent material of the substrate, $\lambda_0$ being a selected single wavelength in range from 250 to 3000 nm, the index of refraction ($n_c$) of the porous metal oxide or metalloid oxide layer is within ±0.03 units of the value of $n_s$ specified by equation (I), the thickness ($d_c$) of the porous metal oxide or metalloid oxide layer is within ±10% of the value of $d_c$ specified by equation (II), and the thickness ($d_c$) of the porous metal oxide or metalloid oxide layer is in a range from 50 to 1000 nm.

Another aspect of the disclosure provides an antireflective coated substrate comprising (a) a transparent material substrate, (b) a first porous metal oxide or metalloid oxide layer on the transparent material substrate, the first porous metal oxide or metalloid oxide layer having an index of refraction within ±0.03 units of the index of refraction of the transparent material substrate, and (c) a second porous metal oxide or metalloid oxide layer above the first porous metal oxide or metalloid oxide layer as an outer layer for the antireflective coated substrate, the second porous metal oxide or metalloid oxide layer having an index of refraction within ±0.15 units of the index of refraction of a selected medium external to the layered substrate.

Further aspects and advantages will be apparent to those of ordinary skill in the art from a review of the following detailed description. While the coatings and methods are susceptible of embodiments in various forms, the description hereafter includes specific embodiments with the understanding that the disclosure is illustrative, and is not intended to limit the invention to the specific embodiments described herein.

BRIEF DESCRIPTION OF THE DRAWINGS

For a more complete understanding of the disclosure, reference should be made to the following detailed description and accompanying drawings wherein.

DETAILED DESCRIPTION

Figure 1:
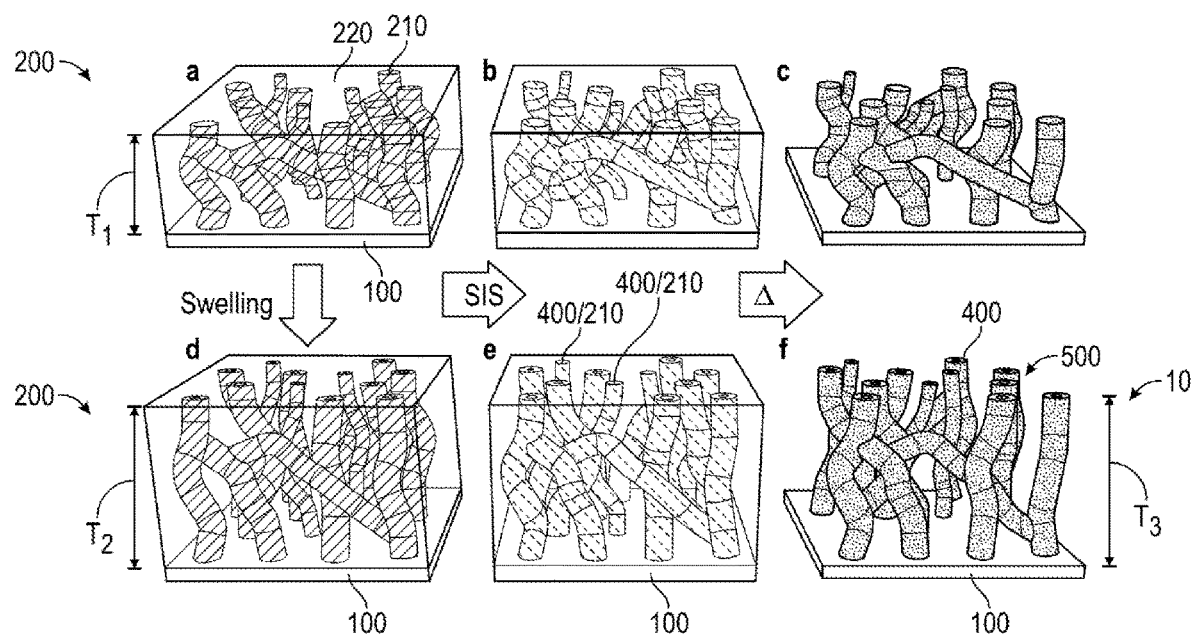
FIG. 1 illustrates a method for forming a coated substrate according to the disclosure.

Provided herein is a method for forming a low refractive index layer on a substrate and antireflective coated substrates. FIG. 1 illustrates a method for forming a coated substrate 10 according to the disclosure. In general, the method disclosed herein includes solvent-assisted sequential infiltration synthesis including the steps of (a) applying a block copolymer layer 200 on a substrate 100, the block copolymer 200 having a polar polymeric block 210 and a non-polar polymeric block 220 (FIG. 1, panel a), (b) swelling the block copolymer 200 with a solvent to increase the block copolymer layer 200 thickness (e.g., from original thickness $T_1$ to swollen thickness $T_2$ as illustrated in FIG. 1, panel d), (c) depositing a metal oxide or metalloid oxide layer 400 on the polar polymeric blocks 210 of the block copolymer layer 200 (FIG. 1, panel e), and (d) removing the block copolymer layer 200 from the substrate 100, thereby forming a porous metal oxide or metalloid oxide layer 500 (e.g., having thickness $T_3$ from the remaining metal oxide or metalloid oxide 400) on the substrate 100 as the coated substrate 10 (FIG. 1, panel f). Panels b and c of FIG. 1 illustrate an analogous coated substrate resulting from a deposition method which omits the solvent swelling step.

The methods of the disclosure provide metal oxide or metalloid oxide coated substrates having one or more advantages including providing low refractive index coatings using gas-phase SIS, efficiently tuning the refractive index of the metal oxide or metalloid oxide layers by modifying the volume fraction of the volume fraction of the polar polymeric block in the block copolymer, efficiently tuning the refractive index of the metal oxide or metalloid oxide layers by modifying the number of SIS cycles, and/or efficiently tuning the thickness of the metal oxide or metalloid oxide layer by modifying the swelling conditions of the block copolymer.

Substrates

The substrate can generally be any material on which a low refractive index layer or anti-reflective coating layer is desired. In embodiments, the substrate comprises a transparent material. The transparent material can include an optically transparent glass material or polymeric material. As used herein, an "optically transparent" material includes a material that is transparent to infrared and/or visible light, for example having a wavelength in a range of about 250 nm to about 1400 nm, about 250 nm to about 700 nm, about 400 nm to about 700 nm, or about 700 nm to about 1400 nm.

The transparent material can have an index of refraction ranging from 1.3 to 2.5, for example, at least 1.3, at least 1.4, at least 1.5, or at least 1.6 and/or up to 1.5, up to 1.6, up to 1.7, up to 1.8, up to 2.0, up to 2.2, or up to 2.5. In embodiments, the transparent material is selected from the group consisting of fused glass (having a refractive index of about 1.458), crown glass (having a refractive index of about 1.485-1.755 or 1.50-1.54), sapphire glass (having a refractive index of about 1.768), alkali-aluminosilicate plate glass (having a refractive index of about 1.5; e.g., "GORILLA GLASS" as a potassium-sodium ion exchange toughened glass), polycarbonate (having a refractive index of about 1.586), poly(methyl methacrylate) (or acrylic glass; having a refractive index of about 1.49); plate glass (having a refractive index of about 1.52), flint glass (having a refractive index of about 1.523-1.925 or 1.60-1.62), and diamond (having a refractive index of about 2.417).

For non-optical applications, the substrate can be any desired material, whether transparent, translucent, and/or opaque.

In embodiments wherein two or more subsequent metal oxide or metalloid oxide layers are provided, the substrate can comprise a previously deposited metal oxide or metalloid oxide layer. In embodiments wherein the substrate comprises a previously deposited metal oxide or metalloid oxide layer, the substrate can have an index of refraction ranging from about 1.05 to about 2.0, or greater (e.g., at least 1.05, at least 1.1, at least 1.2, or at least 1.3 and/or up to 1.1, up to 1.2, up to 1.3, up to 1.5, up to 1.7, or up to 2.0).

In embodiments, the substrate surface does not comprise a coating having a higher refractive index than the intrinsic refractive index of the substrate. In embodiments, the method does not include a step of artificially increasing the refractive index of the surface by depositing on the substrate a coating having a higher refractive index than the intrinsic refractive index of the substrate.

Block Copolymers

The block copolymer generally includes a non-polar polymeric block and a polar polymeric block. The non-polar polymeric block can comprise a non-polar polymeric hydrocarbon. A non-polar polymeric hydrocarbon can include polymers having an ethylenic backbone, optionally with pendant linear or branched alkyl groups and/or aromatic groups, such as where the backbone and the pendant groups are not substituted with any polar atoms or other heteroatoms. Example non-polar polymeric hydrocarbons include polystyrene, polyethylene, polypropylene, polyisobutylene, polybutylstyrene, polybutadiene, and polyisoprene.

The polar polymeric block can comprise a polar polymeric hydrocarbon including an oxygen-containing polar functional group, a nitrogen-containing polar functional group, or a combination thereof. The polar polymeric hydrocarbon can comprise polymers having an ethylenic or ethoxy backbone, optionally with pendant linear or branched alkyl groups and/or aromatic groups that are substituted with one or more of the oxygen-containing polar group and/or the nitrogen-containing functional group. Example oxygen-containing functional groups include, but are not limited to, carbonyls, esters, ethers, hydroxyl groups, amides, and carbamates/urethanes. Example nitrogen-containing functional groups include, but are not limited to, amines (e.g., primary, secondary, and tertiary), aromatic nitrogens (e.g., pyridinyl groups), amides, and carbamates/urethanes. Example polar polymeric hydrocarbons include, but are not limited to, polymethylmethacrylate, polyvinylpyridine (e.g., 4-vinyl pyridine), polybutylmethacrylate, polybutylacrylate, polyhexylacrylate, polydimethylsiloxane, and polyethyleneoxide.

In embodiments, the block copolymer is selected from the group consisting of polystyrene-b-polymethylmethacrylate (PS-b-PMMA), polystyrene-b-polyvinylpyridine (PS-b-PVP or PS-b-P4VP for a 4-vinyl pyridine block), polybutadiene-polybutylmethacrylate, polybutadiene-polydimethylsiloxane, polybutadiene-b-polymethylmethacrylate, polybutadiene-b-polyvinylpyridine, polybutadiene-b-polyvinylpyridine, polyethyleneoxide-b-polyisoprene, polyethyleneoxide-b-polybutadiene, polyethyleneoxide-b-polystyrene, polyethylene-b-polyvinylpyridine, polyisoprene-b-polymethylmethacrylate, polyisoprene-b-polyvinylpyridine, polyisobutylene-b-polybutylmethacrylate, polyisobutylene-b-polydimethoxysiloxane, polyisobutylene-b-polymethylmethacrylate, polyisobutylene-b-polyvinylpyridine, polyethylene-b-polymethylmethacrylate, polystyrene-b-polybutylacrylate, polystyrene-b-polybutylmethacrylate, polystyrene-b-polydimethoxysiloxane, polystyrene-b-lactic acid, and combinations thereof. In embodiments, combinations of block copolymers can be provided as a mixture of copolymers. In embodiments, combinations of block copolymers can be provided as a blend.

The polar polymeric block can be present in the block copolymer in an amount ranging from 10 to 90 wt. %, for example, at least 10 wt. %, at least 15 wt. %, at least 20 wt. %, at least 25 wt. %, at least 35 wt. %, at least 50 wt. %, or at least 65 wt. % and/or up to 35 wt. %, up to 50 wt. %, up to 65 wt. %, up to 75 wt. %, up to 80 wt. %, up to 85 wt. %, or up to 90 wt. % based on the total molecular weight of the block copolymer. In embodiments wherein more than one type of polar polymeric block is present, the weight percent of the polar polymeric block present comprises the sum of the weight percent of all polar polymeric blocks in the block copolymer, based on the total molecular weight of the block copolymer.

The non-polar polymeric block can be present in the block copolymer in an amount ranging from 10 to 90 wt. %, for example, at least 10 wt. %, at least 15 wt. %, at least 20 wt. %, at least 25 wt. %, at least 35 wt. %, at least 50 wt. %, or at least 65 wt. % and/or up to 35 wt. %, up to 50 wt. %, up to 65 wt. %, up to 75 wt. %, up to 80 wt. %, up to 85 wt. %, or up to 90 wt. % based on the total molecular weight of the block copolymer. In embodiments wherein more than one type of non-polar polymeric block is present, the weight percent of the non-polar polymeric block present comprises the sum of the weight percent of all non-polar polymeric blocks in the block copolymer, based on the total molecular weight of the block copolymer.

The overall molecular weight of the block copolymer and the relative distribution between polar and non-polar blocks can be selected to control the porosity of the resulting porous metal oxide or metalloid oxide layer. In general, the porosity of the resulting metal oxide or metalloid oxide layer is proportional to the relative amount of the non-polar block in the block copolymer. In embodiments, the polar polymeric block can be present in the block copolymer in an amount ranging from 10 to 90 wt. % (or the various sub-ranges noted above) and the non-polar polymeric block can be present in the block copolymer in an amount ranging from 10 to 90 wt. % (or the various sub-ranges noted above). In embodiments, the block copolymer includes only the polar polymeric block and the non-polar polymeric block. In embodiments, the block copolymer includes a third or more polymeric blocks that are different from the polar polymeric block and the non-polar polymeric block.

The block copolymer can have a molecular weight (e.g., a number-average molecular weight or a weight-average molecular weight) ranging from 20 to 500 kDa, for example, at least 20 kDa, at least 40 kDa, at least 60 kDa, at least 80 kDa, at least 100 kDa, or at least 200 kDa and/or up to 50 kDa, up to 100 kDa, up to 200 kDa, or up to 500 kDa.

The block copolymer layer, as applied to the substrate, can have a thickness ranging from 10 to 1000 nm, for example, at least 10 nm, at least 20 nm, at least 30 nm, at least 40 nm, at least 50 nm, at least 80 nm, at least 100 nm, or at least 200 nm and/or up to 30 nm, up to 40 nm, up to 50 nm, up to 60 nm, up to 80 nm, up to 100 nm, up to 200 nm, up to 500 nm, or up to 1000 nm. As used herein the thickness of the block copolymer "as applied to the substrate" refers to the thickness of the block copolymer layer after application to the substrate (such as after evaporation of any coating solvent) but prior to swelling.

The thickness can be controlled by the concentration of block copolymer in a coating solution applied to the substrate and/or by applying multiple block copolymer layers sequentially. Application of the block copolymer layer can be performed by any suitable dipping, coating, spraying, or casting method, such as using a doctor blade technique or spin casting as illustrated in the examples.

Swelling

Swelling is a nondestructive strategy to induce and modify the porosity in block copolymer materials. Swelling generally includes contacting the block copolymer layer with a solvent for a desired time and at a desired temperature by any suitable means, for example by immersing the substrate with the non-swollen block copolymer layer in a solvent bath. After contacting the block copolymer layer with the solvent to achieve the desired resulting increased thickness, the swollen polymer is preferably dried. The swollen polymer can be dried under a nitrogen or other inert atmosphere to remove the solvent prior to metal oxide or metalloid oxide deposition. In embodiments, the drying process removes at least 75%, at least 80%, at least 90%, at least 95%, or at least 98% and/or up to about 85%, up to about 90%, up to about 95%, up to about 98%, or up to about 100% of the solvent from the swelling process. In general, it is advantageous to remove as much solvent as possible. Without intending to be bound by theory, it is believed that residual solvent on the surface of the swollen block copolymer (including in the interior porosities between copolymer molecules) may react with the metal oxide or metalloid oxide precursors, disrupting the formation of the metal oxide or metalloid oxide layer.

The swelling can generally be performed with any solvent that can infiltrate the block copolymer and increase the available space between the block copolymer molecules. A non-swollen block copolymer layer has a diffusion-limited maximum thickness of the eventual porous metal oxide or metalloid oxide film, notwithstanding the thickness of the non-swollen block copolymer layer. Depending on the particular block copolymer, this diffusion-limited maximum thickness can be about 50 nm, such as at least 20 nm, at least 30 nm, or at least 40 nm and/or up to 50 nm, up to 60 nm, or up to 80 nm. Swelling of the block copolymer layer to an increased thickness has the effect of increasing the available space between the block copolymer molecules, thus reducing the diffusion limitation on metal oxide or metalloid oxide infiltration depth/growth. The increase in available space provides complementary benefits of an increased thickness of the resulting porous metal oxide or metalloid oxide layer, an increased porosity of the resulting porous metal oxide or metalloid oxide layer, and a reduced index of refraction of the resulting porous metal oxide or metalloid oxide layer. In general, the solvent is selective to the minority block of the block copolymer. Upon drying, pores are generated throughout the film in the positions where the minority block has collapsed. Examples of solvents include, but are not limited to, ethanol, methanol, propanol, acetic acid, tetrahydrofuran, acetone, thioacetone, acetonitrile, ethyl acetate, methyl ethyl ketone (i.e., butanone), dimethylformamide (DMF), diethyl carbonate (DEC), toluene, benzene, methoxybenzene, chloroform, chlorobenzene, dichloromethane, and combinations thereof. In embodiments, the solvent comprises ethanol. In embodiments, the solvent comprises chloroform.

The ratio of the thickness of the block copolymer layer after swelling to the thickness of the block copolymer layer prior to swelling can be in a range of 1.1 to 3, for example, a relative final:intial thickness ratio of at least 1.1, at least 1.2, at least 1.3, at least 1.4, 1 at least 0.5, or at least 2 and/or up to 1.3, up to 1.4, up to 1.5, up to 1.7, up to 2, or up to 3. The block copolymer thickness prior to swelling generally corresponds to the block copolymer layer as applied to the substrate, such as after evaporation or removal of any coating solvent for the block copolymer.

Swelling the block copolymer layer with the solvent can be for a time ranging from 10 to 600 minutes, for example, at least 10 minutes, at least 20 minutes, at least 30 minutes, at least 60 minutes, or at least 120 minutes and/or up to 30 minutes, up to 60 minutes, up to 120 minutes, up to 240 minutes, up to 360 minutes, up to 480 minutes, or up to 600 minutes.

The temperature at which the swelling of the block copolymer template is performed can impact the porosity of the resulting metal oxide or metalloid oxide layer. In general, as the temperature of swelling increases, the porosity of the resulting metal oxide or metalloid oxide layer increases, resulting in substantially lower refractive indices. Further, as the temperature of swelling increases, the thickness of the resulting metal oxide or metalloid oxide layer generally increases. Swelling the block copolymer layer with the solvent can be at a temperature ranging from 20 to 120° C., for example, at least 20° C., at least 25° C., at least 35° C., or at least 50° C. and/or up to 50° C., up to 60° C., up to 70, up to 80° C., up to 100° C., or up to 120° C.

In embodiments, the swelling of the block copolymer layer with the solvent can be for a time ranging from 10 to 600 minutes and at a temperature ranging from 20 to 120° C.

Deposition of Metal Oxide or Metalloid Oxide

The metal oxide or metalloid oxide can be deposited using any method that allows the metal oxide or metalloid oxide or precursors of the metal oxide or metalloid oxide to infiltrate the porosities of the polar polymeric block of the block copolymer. Thus, when a metal oxide or metalloid oxide is deposited on a polar polymeric block of a block copolymer, the metal oxide or metalloid oxide is provided on the available surface area of the polar polymeric block, including inside the space between the block copolymer molecules (i.e., porosities). Deposition is selective in that the metal oxide or metalloid oxide is formed on the polar polymeric blocks but is not substantially formed on the non-polar blocks. As used herein, "not substantially formed on the non-polar blocks" means that less than 10%, less than 5%, less than 3%, or less than 1% of the surface area of the non-polar blocks has metal oxide or metalloid oxide deposited thereon.

A suitable deposition method is atomic layer deposition (ALD). ALD is well known in the art. In general, atomic layer deposition is a thin film deposition technique based on gas phase chemical precursors that react with at least a portion of the block copolymer surface (or coating thereon) one at a time in a sequential, self-limiting, manner, to form the layer comprising the metal oxide or metalloid oxide. In ALD, the first precursor molecules can only react with a finite number of reactive sites on the block copolymer. Once those sites react with the first precursor, the growth stops and the first precursor is flushed from the ALD reactor and the second precursor is introduced. By alternating exposure of the first precursor and the second precursor, a thin film of metal oxide or metalloid oxide is deposited. The resulting deposit is a conformal coating. The sequence of introducing the first precursor, flushing the first precursor, introducing the second precursor, and flushing the second precursor constitutes an ALD cycle (i.e., for a two precursor system). The growth rate of the ALD coating is defined in terms of growth per ALD cycle.

In embodiments, the metal oxide or metalloid oxide layer comprises a metal oxide or metalloid oxide selected from the group consisting of alumina ($Al_2O_3$), silica ($SiO_2$), titanium dioxide ($TiO_2$), zinc oxide (ZnO), hafnium dioxide ($HfO_2$), yttrium oxide ($Y_2O_3$), and combinations thereof. In embodiments, the metal oxide or metalloid oxide layer comprises a metal oxide or metalloid oxide selected from the group consisting of alumina ($Al_2O_3$), silica ($SiO_2$), titanium dioxide ($TiO_2$), zinc oxide (ZnO), and combinations thereof. In embodiments, the metal oxide or metalloid oxide layer comprises a rare earth oxide (e.g., an oxide from one or more of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb) and yttrium (Y)). Metal oxide or metalloid oxide layers can be formed by reacting a first metal or metalloid organic precursor with a second precursor such as water. Although the growth rate for ALD from metal organic or metalloid organic precursors is generally slower than with metal-halide precursors, metal organic and metalloid organic precursors can provide an impurity-free coating without generating acids as byproducts. Suitable metal or metalloid organic precursors for the formation of metal oxide or metalloid oxide layers include, but are not limited to trimethylaluminum (TMA) (e.g., for preparation of an alumina layer when used with water), tris(dimethylamido)silane, tetrakis(dimethylamido)zirconium, titanium tetrachloride, titanium tetraisopropoxide, nickel(II) acetylacetonate, palladium(II) hexafluoroacetylacetonate, copper bis(2,2,6,6-tetramethyl-3,5-heptanedionate, metallocenes (($C_5H_5)_2$M where M can be, for example, Cr, Fe, Co, Ni, Pb, Zr, Ru, Rh, Sm, Ti, V, Mo, W, or Zn), and half-metallocene compounds (e.g., ($C_5H_5$)M($CH_3)_3$ and ($CH_3C_5H_4$)M($CH_3$), wherein M can be, for example, Cr, Fe, Co, Ni, Pb, Zr, Ru, Rh, Sm, Ti, V, Mo, W, or Zn).

In embodiments, the ALD cycle can include two precursors, three precursors, four precursors, or more than four precursors. In embodiments, depositing the metal oxide or metalloid oxide layer comprises performing atomic layer deposition (i) to selectively deposit a first precursor on polar polymeric blocks of the block copolymer layer in a first deposition half-cycle, and (ii) to react the deposited first precursor with a second precursor in a second subsequent deposition half-cycle, thereby forming the metal oxide or metalloid oxide layer. Deposition can be selective for the non-polar block or polar block, depending on the binding affinity of the first metal oxide or metalloid oxide precursor with the polar functional groups of the polar polymeric blocks. In embodiments, the metal or metalloid oxide layer can be formed on the polar polymeric blocks and not substantially formed on the non-polar blocks (e.g., due to a binding affinity of the first metal oxide or metalloid oxide precursor with the polar functional groups of the polar polymeric blocks and a lack of such binding affinity with the non-polar polymeric blocks).

The depositing of the metal oxide or metalloid oxide layer can include performing a plurality of deposition cycles. A plurality of sequential infiltration synthesis cycles can be used to control the amount of metal oxide or metalloid oxide deposited. The plurality of deposition cycles can include at least 2, at least 3, at least 4 or at least 5 cycles and/or up to 4, up to 6, up to 8, up to 10, up to 15, or up to 20 cycles. The number of deposition cycles, whether one cycle or more than one cycle, can be selected to control the amount of metal oxide or metalloid oxide deposited, which in turn controls the porosity and index of refraction of the eventual porous metal oxide or metalloid oxide layer. The porosity is inversely proportional to the number of deposition cycles, and the index of refraction is directly proportional to the number of deposition cycles. This tunable selection of porosity and index of refraction, combined with a selectable thickness of the eventual porous metal oxide or metalloid oxide layer via controlled block copolymer swelling, permits selection of a desired pair of index of refraction and porous metal oxide or metalloid oxide thickness as appropriate for an anti-reflective layer according to known optical relationships.

In general, suitable precursors are able to infiltrate submicron porosities of the block copolymer and reach the substrate surface, can form stable layers that do not self-decompose or react with the surface reaction byproducts, have a high surface reactivity and low surface adsorption property (such that once reacted it can be easily flushed out), and react at relatively low temperatures below the glass transition temperature of the block copolymers.

The metal oxide or metalloid oxide layer can have a thickness corresponding to that of the block copolymer layer thickness after swelling. Without intending to be bound by theory, it is believed that the swelling of the block copolymer facilitates increasing the porosity of the block copolymer and infiltration of the metal oxide or metalloid oxide precursors through the entire thickness of the block copolymer to the substrate surface, thereby avoiding diffusion-limited penetration of the metal oxide or metalloid oxide precursors. Thus, the resulting metal oxide or metalloid oxide layer can have a thickness that is the same or substantially the same as the block copolymer layer thickness after swelling. As used herein, the thickness of the metal oxide or metalloid oxide is "substantially the same" as the thickness of the block copolymer after swelling if the thickness of the metal oxide or metalloid oxide layer is at least 90%, at least 95%, at least 98%, or at least 99% of the thickness of the block copolymer layer after swelling.

Removing the Block Copolymer

In general, after the metal oxide or metalloid oxide layer is deposited, the block copolymer can be removed to provide a porous metal oxide or metalloid oxide layer on the substrate. The entire or nearly entire block copolymer layer can be removed such that the deposited metal oxide or metalloid oxide layer on the polar polymeric blocks remains after polymer removal to constitute the porous metal or metalloid oxide layer adhered to the substrate. Any method of removing the block copolymer can be used, provided said method leaves the metal oxide or metalloid oxide layer intact. For example, any heat treatment or annealing process performed at a temperature above the decomposition temperature of the block copolymer can be used. In embodiments, the removing the block copolymer layer from the substrate comprises performing thermal annealing, plasma treatment, ozone treatment, or combinations thereof. In embodiments, the removing the block copolymer layer from the substrate comprises performing thermal annealing.

The formed porous metal oxide or metalloid oxide layer can have a thickness ranging from 10 to 1000 nm, for example, at least 10 nm, at least 20 nm, at least 30 nm, at least 40 nm, at least 50 nm, at least 60 nm, at least 70 nm, at least 80 nm, at least 100 nm, or at least 200 nm and/or up to 30 nm, up to 40 nm, up to 50 nm, up to 60 nm, up to 80 nm, up to 100 nm, up to 150 nm, up to 200 nm, up to 500 nm, or up to 1000 nm. The thickness generally is the same or substantially the same as the block copolymer thickness after swelling.

The formed porous metal oxide or metalloid oxide layer can have a porosity ranging from 10 to 90 wt. %, for example, at least 10 wt. %, at least 15 wt. %, at least 20 wt. %, at least 25 wt. %, at least 35 wt. %, at least 50 wt. %, or at least 65 wt. % and/or up to 35 wt. %, up to 50 wt. %, up to 65 wt. %, up to 75 wt. %, up to 80 wt. %, up to 85 wt. %, up to 90 wt. %. The porosity value can be controlled based on the relative distribution between polar and non-polar blocks in the block copolymer, as well as the amount of deposited metal oxide or metalloid oxide, such as based on the number of deposition cycles performed.

The formed porous metal oxide or metalloid oxide layer can have an index of refraction value of about 0.05 to 0.5 units less than a corresponding index of refraction for a bulk metal oxide or bulk metalloid oxide material. For example, the formed porous metal oxide or metalloid oxide layer can have at least 0.05, at least 0.1, at least 0.2, or at least 0.3 index of refraction units and/or up to 0.2, up to 0.3, up to 0.4, or up to 0.5 index of refraction units lower for the porous metal or metalloid oxide layer relative to its bulk material counterpart. The formed porous metal oxide or metalloid oxide layer can have an index of refraction ranging from 1.0 to 2.5, for example, at least 1.0, at least 1.02, at least 1.05, at least 1.08, at least 1.1, at least 1.15, at least 1.2, at least 1.25, at least 1.3, at least 1.4, or at least 1.5 and/or up to 1.3, up to 1.4, up to 1.5, up to 1.6, up to 1.8, up to 2.0, or up to 2.5.

In some embodiments, the formed porous metal oxide or metalloid oxide layer has an index of refraction ($n_c$) and a thickness ($d_c$) selected according to the following relationship:

$$n_c = (n_s n_m)^{0.5} \quad (I)$$

$$d_c = \lambda_0 / (4 n_c) \quad (II)$$

wherein $n_s$ is the index of refraction of the transparent material of the substrate, $n_m$ is the index of refraction of the medium through which incident light passes before passing through the formed porous metal oxide or metalloid oxide layer and the transparent material of the substrate, $\lambda_0$ is an incident wavelength to be fully transmitted through the porous metal oxide or metalloid oxide layer and the transparent material of the substrate, wherein the index of refraction ($n_c$) of the porous metal oxide or metalloid oxide layer is within ±0.03 units of the value of $n_s$ specified by equation (I); and the thickness ($d_c$) of the porous metal oxide or metalloid oxide layer is within ±10% of the value of $d_c$ specified by equation (II). Selection of the index of refraction and the thickness of the porous metal oxide or metalloid oxide layer according to the foregoing relationships can be desirable, for example, when preparing an antireflective coated substrate that includes only a single antireflective layer with (e.g., a porous metal oxide or metalloid oxide layer with a single index of refraction value).

The index of refraction of the transparent material of the substrate is 1.0 when air is used as the incident light medium. The index of refraction of the transparent material of the substrate can have a value ranging from about 1.0 to about 1.5, depending on the fluid (liquid or gas) medium, for example, 1.33 for water. The incident wavelength, $\lambda_0$ can be a selected single wavelength in range from 250 to 3000 $n_m$, for example, any value within the visible spectrum (about 400-700 $n_m$), the infrared spectrum (about 700-1000 $n_m$), the near infrared spectrum (about 700-1400 $n_m$).

The reduction of light reflected off the substrate depends on destructive interference of the light reflected at the medium/porous metal oxide or metalloid oxide layer interface and the light reflected at the porous metal oxide or metalloid oxide layer/substrate interface. This condition can be achieved for a given wavelength A and angle of incidence when the thickness of the ARC is about $\lambda/4$ and the value of the index of refraction ($n_c$) of the porous metal oxide or metalloid oxide is similar to the value of the index of refraction of the substrate. In embodiments, the index of refraction ($n_c$) of the porous metal oxide or metalloid oxide layer is within +0.03, within ±0.02, or within ±0.01 index of refraction units of the value of $n_s$ specified by equation (I) and the thickness ($d_c$) of the porous metal oxide or metalloid oxide layer is within ±1%, within +2%, within ±3%, within +5%, within +7%, or within ±10% of the value of $d_c$ specified by equation (II).

In general, for any selection of a single value for $n_m$ and a single value for $\lambda_0$ within the generally disclosed ranges, the actual index of refraction ($n_c$) and the actual thickness ($d_c$) of the formed porous metal oxide or metalloid oxide layer can be controlled to be within a narrow margin of the target values specified by equations (I) and (II).

In applications where reflection over a broad spectral range is advantageous, light reflection over the spectral range can be minimized when the formed porous metal oxide or metalloid oxide layer refractive index exhibits a gradient change along the thickness (e.g., in a direction generally normal to the surface of the substrate being coated) from the value of the substrate material at the substrate/porous metal oxide or metalloid oxide layer interface down to the refractive index of the medium (e.g., air, water, or other fluid medium) at the porous metal oxide or metalloid oxide layer/medium interface.

Figure 2:
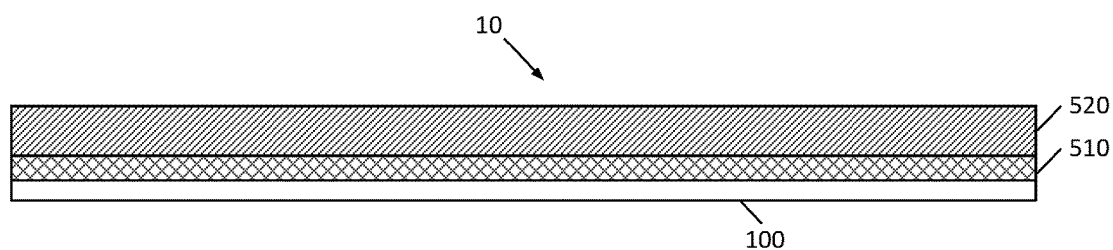
FIG. 2 illustrates a coated substrate according to the disclosure including multiple porous metal oxide or metalloid oxide layers.

As described above, a low refractive index layer can be formed on a substrate by (a) applying a block copolymer layer on a substrate, the block copolymer comprising a polar polymeric block and a non-polar polymeric block, (b) swelling the block copolymer layer with a solvent for a time and at a temperature sufficient to increase the block copolymer layer thickness, (c) depositing a metal oxide or metalloid oxide layer on polar polymeric blocks of the block copolymer layer, and (d) removing the block copolymer layer from the substrate, thereby forming a porous metal oxide or metalloid oxide layer on the substrate. A graded-index antireflective layer can be prepared by performing steps (a) to (d) of the method of the disclosure at least twice in succession to form at least two porous metal oxide or metalloid oxide layers having different index of refraction values. FIG. 2 illustrates a graded-index antireflective coated substrate 10 according to the disclosure including at least a first porous metal oxide or metalloid oxide layer 510 on a substrate 100 and a second porous metal oxide or metalloid oxide layer 520 on the first porous metal oxide or metalloid oxide layer 510. In a first cycle of steps (a) to (d) the substrate in part (a) is an uncoated transparent material substrate and in a second cycle of steps (a) to (d), the substrate in part (a) is the porous metal oxide or metalloid oxide layer adjacent to the transparent material substrate, resulting from part (d) of the first cycle. Steps (a) to (d) can be repeated to form third and subsequent layers. Each second and subsequent porous metal oxide or metalloid oxide layer can be selected to have different thickness and/or index of refraction values, for example, when forming a graded-index antireflective coating. Similarly, each second and subsequent porous metal oxide or metalloid oxide layer can be formed from the same or different metal oxide or metalloid oxide material. For example, the first metal oxide or metalloid oxide layer provided adjacent to the substrate and forming the metal oxide or metalloid oxide layer/substrate interface can be a porous alumina (having a relatively higher index of refraction value) and the second or subsequent, outer porous metal oxide or metalloid oxide layer that forms the metal oxide or metalloid oxide/medium interface can be a porous silica (having relatively lower index of refraction values).

In embodiments where steps (a) to (d) are performed at least twice in succession to form at least two porous metal oxide or metalloid oxide layers, the first porous metal oxide or metalloid oxide layer formed adjacent to the transparent material substrate can have an index of refraction within ±0.03 units, within ±0.02 units, or within +0.01 index of refraction units, of the index of refraction of the transparent material substrate. In embodiments where steps (a) to (d) are performed at least twice in succession to form at least two porous metal oxide or metalloid oxide layers, an outer porous metal oxide or metalloid oxide layer formed can have an index of refraction within +0.15 units, within +0.1 units, within ±0.08 units, within ±0.05 units, within ±0.03 units, within ±0.02 units, or within ±0.01 index of refraction units of the index of refraction of a selected medium external to the layered substrate. If more than two porous metal oxide or metalloid oxide layers are formed in sequence, the outer layer is the final layer in the series of subsequent layers, having a surface adjacent to the external environment, for example, air or water. In embodiments, the method includes (i) a first porous metal oxide or metalloid oxide layer formed adjacent to the transparent material substrate having an index of refraction within ±0.03 units of the index of refraction of the transparent material substrate, and (ii) an outer porous metal oxide or metalloid oxide layer formed having an index of refraction within ±0.15 units of the index of refraction of a selected medium external to the layered substrate (e.g., air (1.0), water (1.33), or other fluid medium as the external medium based on which the reference external medium index of refraction is selected).

Antireflective Coated Substrates

The disclosure further provides antireflective coated substrates. The antireflective coated substrates can be prepared using any of the methods disclosed herein. The components of the antireflective coated substrates can be any component described herein with regard to the method of forming a low refractive index layer on a substrate.

In embodiments, the antireflective coated substrate comprises (a) a transparent material substrate, (b) a porous metal oxide or metalloid oxide layer on the transparent material substrate, wherein the porous metal oxide or metalloid oxide layer has an index of refraction ($n_c$) and a thickness ($d_c$) selected according to the following relationship:

$$n_c = (n_s n_m)^{0.5} \quad \text{(I)}$$

$$d_c = \lambda_0/(4n_c) \quad \text{(II)}$$

wherein $n_s$ is the index of refraction of the transparent material of the substrate, $n_m$ is the index of refraction of the medium through which incident light passes before passing through the formed porous metal oxide or metalloid oxide layer and the transparent material of the substrate, $\lambda_0$ is an incident wavelength to be fully transmitted through the porous metal oxide or metalloid oxide layer and the transparent material of the substrate, $\lambda_0$ being a selected single wavelength in range from 250 to 3000 $n_m$, the index of refraction ($n_c$) of the porous metal oxide or metalloid oxide layer is within ±0.03 units of the value of $n_s$ specified by equation (I), the thickness ($d_c$) of the porous metal oxide or metalloid oxide layer is within ±10% of the value of $d_c$ specified by equation (II), and the thickness ($d_c$) of the porous metal oxide or metalloid oxide layer is in a range from 50 to 1000 $n_m$. The thickness of the porous metal oxide or metalloid oxide layer can be, for example, at least 50 $n_m$, at least 60 $n_m$, at least 70 $n_m$, at least 80 $n_m$, at least 100 $n_m$, or at least 200 $n_m$ and/or up to 60 $n_m$, up to 80 $n_m$, up to 100 $n_m$, up to 150 $n_m$, up to 200 $n_m$, up to 500 $n_m$, or up to 1000 $n_m$. Selection of the index of refraction and the thickness of the porous metal oxide or metalloid oxide layer according to the foregoing relationships can be desirable, for example, when preparing an antireflective coated substrate that includes only a single antireflective layer with (e.g., a porous metal oxide or metalloid oxide layer with a single index of refraction value).

In embodiments, the antireflective coated substrate comprises (a) a transparent material substrate, (b) a first porous metal oxide or metalloid oxide layer on the transparent material substrate, the first porous metal oxide or metalloid oxide layer having an index of refraction within ±0.03 units of the index of refraction of the transparent material substrate, and (c) a second porous metal oxide or metalloid oxide layer above the first porous metal oxide or metalloid oxide layer as an outer layer for the antireflective coated substrate, the second porous metal oxide or metalloid oxide layer having an index of refraction within ±0.15 units of the index of refraction of a selected medium external to the layered substrate. The first porous metal oxide or metalloid oxide layer can have an index of refraction within ±0.03, within +0.02, or within ±0.01 units of the index of refraction of the transparent material substrate. The second porous metal oxide or metalloid oxide layer can have an index of refraction within ±0.15, within +0.1, within +0.08, within ±0.05, within +0.03, within ±0.02, or within ±0.01 units of the index of refraction of the transparent material substrate.

The second, outer layer of the antireflective coated substrate is the final layer in a series of subsequent layers. The final layer has a surface adjacent to the external environment. The index of refraction of the external medium can be selected to be 1.0 for intended uses with air as the incident light medium, or can be selected to be any value for a different fluid (liquid or gas) medium, such as a value ranging from 1.0 to 1.5, for instance 1.33 for water.

The first layer is "on" (i.e., in contact with/adhered to) the transparent substrate, and the second layer is "above" the first layer, allowing for one or more other intermediate porous metal oxide or metalloid oxide layers between the first and second layers in order to provide a more gradual change in index of refraction values for the composite antireflective coated substrate between the maximum and minimum values represented by the first and second layers.

The above described aspects and embodiments can be better understood in light of the following examples, which are merely intended to be illustrative and are not meant to limit the scope in any way.

EXAMPLES

Example 1: Single Layer ARC

Poly(styrene-block-4-vinylpyridine) (PS-b-P4VP) block copolymer (BCP) films were prepared by spin coating from 2 and 6 wt % toluene solutions (to prepare films of different thicknesses) onto clean silicon substrates with native silicon dioxide films having ALD-deposited 5 $n_m$ alumina adhesion layers and clean glass substrates. The PS-b-P4VP block copolymer had a total molecular weight of about 100 kDa, with PS blocks of about 75 kDa and P4VP blocks of about 25 kDa (denoted herein as PS-b-P4VP (75 k-b-25 k)). After BCP deposition, the samples were kept on a hot plate at 180° C. for 10 minutes to evaporate residual toluene and to induce microphase separation. The thicknesses of the resulting polymer films varied from 70±5 $n_m$ to 400±12 $n_m$ for the 2 and 6 wt % toluene solutions, respectively.

Samples were immersed in pure ethanol and kept at one of 55° C., 65° C., or 75° C. for 1 hour. Upon completion, the samples were dried under nitrogen gas flow.

Sequential infiltration synthesis (SIS) was performed on samples wherein the BCP was swollen and control samples having no BCP swelling, using GEMStar and Thermal ALD system. $Al_2O_3$ coatings were produced by infiltrating the polymer films using binary reactions of trimethyl aluminum ($Al(CH_3)_3$,TMA)/$H_2O$. Exposure of BCP films to TMA vapor resulted in selective binding to polar groups in microphase separated polymer domains. Selectively bound Al—$(CH_3)_2$ reacts with water molecules in the subsequent SIS half-cycle. The SIS was performed at 90° C., below the polymer glass transition temperatures, to avoid the flow of swelling-formed predefined polymer structures. All precursors were introduced into the reactor as room temperature vapors. The silicon or glass substrates having polymer films thereon were loaded on a stainless steel tray and kept in a 200 sccm nitrogen flow for at least 30 minutes prior to deposition. One cycle of SIS was performed as follows: 10 mTorr of the synthesis reactant precursor was admitted into the reactor for 400 seconds. After that, the excess of the reactant was evacuated and followed by admitting 10 mTorr of water for 120 seconds. The chamber was then purged with 200 sccm of nitrogen to remove not-infiltrated byproducts. The cycle was repeated several times to grow films of different porosity.

Following SIS, the polymer component of the resulting film was removed by baking the samples in a Thermo Fisher Scientific tube furnace at 45° C. for 1 hour while flowing oxygen gas at 50 sccm. Upon cooling, near-complete removal of carbon was confirmed with energy dispersive X-ray spectroscopy analysis of the film. The films were analyzed for metal oxide ($Al_2O_3$) thickness, porosity, and refractive index (Tables 1 and 2).

TABLE 1

Dependence of porosity and refractive index on the number of SIS cycles.

| Block copolymer | Number of SIS cycles | Porosity of metal oxide layers having thicknesses of about 48.7 ± 5.1 nm. | Approximate Refractive Index |
|---|---|---|---|
| PS-b-P4VP (75k-b-25k), 80 nm thick; no swelling | 2 cycles | 72% | 1.1 |
| PS-b-P4VP (75k-b-25k), 80 nm thick; no swelling | 3 cycles | 68% | 1.15 |
| PS-b-P4VP (75k-b-25k), 80 nm thick; no swelling | 5 cycles | 67% | 1.18 |
| PS-b-P4VP (75k-b-25k), 80 nm thick; no swelling | 8 cycles | 53% | 1.23 |

TABLE 2

Dependence of metal oxide thickness, porosity, and refractive index on BCP (PS-b-P4VP (75k-b-25k)) swelling conditions

| Thickness of BCP prior to swelling | Swelling conditions | Thickness of resulting metal oxide layer (10 cycles) | Porosity | Refractive Index |
|---|---|---|---|---|
| 80 nm | None | 48 nm | 40% | 1.31 |
| 80 nm | Ethanol, 1 hour at 55° C. | 53 nm | 67% | 1.17 |
| 80 nm | Ethanol, 1 hour at 65° C. | 75 nm | 68% | 1.16 |
| 80 nm | Ethanol, 1 hour at 75° C. | 105 nm | 71% | 1.14 |
| 400 ± 12 nm | None | 48 nm | — | |
| 400 ± 12 nm | Ethanol, 1 hour at 75° C. | 447 nm | — | |

Thus, Example 1 demonstrates antireflective coated substrates according to the disclosure prepared by the methods of the disclosure. Example 1 demonstrates that the thickness of the block copolymer layer can be controlled by the concentration of block copolymer in the solution used to apply the block copolymer to the substrate. Example 1 further shows that the amount of swelling of the copolymer can be controlled by the temperature at which swelling occurs. Example 1 further shows that the porosity of the metal oxide layers decreases with an increase in the number of ALD cycles, and that the refractive index of the resulting material increases with an increase in the number of ALD cycles.

Example 2: Multiple Layer ARC

Coated glass substrates having three stacked layers of $Al_2O_3$ were prepared. The first, interior layer had a thickness of 50 $n_m$ and a refractive index of 1.54, the second, middle layer had a thickness of 190 $n_m$ and a refractive index of 1.4, and the final, outer layer had a thickness of 200 $n_m$ and a refractive index of 1.1. SIS deposition of $Al_2O_3$ was performed as described in Example 1, with the first layer being deposited on the glass substrate, the second layer being deposited on the first layer, and the third layer being deposited on the second layer.

The first layer was obtained by SIS using 80 $n_m$-thick polystyrene-block-poly(methyl methacrylate) (PS-b-PMMA) and 10 SIS cycles. PS-b-P4VP templates of 80 $n_m$ and 10 and 5 SIS cycles, respectively, were used to form the second and third layers. The first and second layers were annealed at 450° C. under air flow for 1 hour to remove the polymer prior to spin-casting of the second and third layers of polymer template. The final film was porous and rather uniform. Wavelength dependence of specular reflectivity demonstrated that the substrate with three layers of aluminum oxide SIS coating reflects between 0.4% and 0.1% of the light in the range of 400-1050 $n_m$ at normal incidence. Transmittance increased from about 92.5% (for an uncoated glass sample) to about 96.5% in a narrow range around 785 $n_m$ for a single-layer coated sample, and to about 95% across the whole visible light spectral range for the three-layer films. More specifically, transmittance for the single-layer coating had values spanning about 91% to about 97% for wavelengths ranging from 400-1050 $n_m$, while transmittance for the three-layer coating had a narrower distribution, with values spanning about 94% to about 96% for wavelengths ranging from 400-1050 $n_m$ (i.e., more consistent and higher average transmittance values across the 400-1050 $n_m$ range).

Thus, Example 2 demonstrates a multi-layered, gradient ARC coated substrates of the disclosure prepared according to methods of the disclosure.

Example 3: Single Layer ARC

Silicon substrates were coated with polystyrene-block-poly(methyl methacrylate) (PS-b-PMMA) copolymers having volume or weight fractions of polystyrene (PS) and poly(methyl methacrylate) (PMMA) as described in Table 3 (i.e., with the molecular weights in kDa of the respective PS and PMMA blocks indicated in parentheses). $Al_2O_3$ layers were deposited by SIS as described in Example 1. 5 SIS cycles were used to deposit the $Al_2O_3$. The thickness, porosity, and refractive index of the resulting metal oxide layers were determined (Table 3).

TABLE 3

Dependence of porosity and refractive index on the volume fraction of the non-polar block in the block copolymer.

| Block Copolymer | Thickness | Porosity | Refractive Index at 785 nm |
|---|---|---|---|
| PS-b-PMMA (15k-b-65k) | 42 nm - not swollen | 25% | 1.39 |
| PS-b-PMMA (37k-b-37k) | 53 nm - not swollen | 48% | 1.27 |
| PS-b-PMMA (42k-b-16k) | 53 nm - not swollen | 60% | 1.2 |

Thus, Example 3 demonstrates that the porosity of the metal oxide film increases, and the refractive index decreases, with increasing volume fractions of non-polar blocks in the block copolymer.

The foregoing description is given for clearness of understanding only, and no unnecessary limitations should be understood therefrom, as modifications within the scope of the invention may be apparent to those having ordinary skill in the art.

Throughout this specification and the claims which follow, unless the context requires otherwise, the word "comprise" and variations such as "comprises" and "comprising" will be understood to imply the inclusion of a stated integer, component, or step or groups of integers, components, or steps, but not to the exclusion of any other integer, component, or step or groups of integers, components, or steps.

Throughout the specification where compositions are described as including components or materials, it is contemplated that the composition can also consist essentially of, or consists of, any combination of the recited components or materials, unless described otherwise. Likewise, where methods are described as including particular steps, it is contemplated that the methods can also consist essentially of, or consists of, any combination of the recited steps, unless described otherwise. The invention illustratively disclosed herein suitably may be practiced in the absence of any element or step which is not specifically disclosed herein.

All patents, publications, and references cited herein are hereby fully incorporated by reference. In case of conflict between the present disclosure and incorporated patents, publications, and references, the present disclosure should control.

What is claimed is:

1. A method for forming a low refractive index layer on a substrate, the method comprising:
   (a) applying a block copolymer layer on the substrate, the block copolymer comprising a polar polymeric block and a non-polar polymeric block, and heating the substrate and block copolymer to induce microphase separation thereby providing a microphase separated block copolymer;
   (b) completely immersing the microphase separated block copolymer in a liquid consisting of a solvent at a temperature ranging from 55° C. to 120° C., thereby swelling the block copolymer layer and increasing the block copolymer layer thickness followed by removing at least 75% of the liquid solvent form the block copolymer layer to provide a dried, swollen, block copolymer;
   (c) depositing a metal oxide or metalloid oxide layer on the polar polymeric block of the dried, swollen, block copolymer layer, comprising reacting a gas phase chemical precursor with at least a portion of the surface of the dried, swollen, block copolymer layer; and
   (d) removing the block copolymer layer from the substrate, thereby forming a porous metal oxide or metalloid oxide layer on the substrate as the low refractive index layer;
   wherein the ratio of the thickness of the block copolymer in step (c) relative to the thickness of the block copolymer layer in step (a) is in a range of 1.1 to 3;
   wherein the porous metal oxide or metalloid oxide layer has a thickness of at least 70 nm and a porosity of at least 65%; and
   wherein the porous metal oxide or metalloid oxide layer has an index of refraction at least 0.3 lower than the refractive index of the metal oxide or metalloid oxide when provided as a bulk material.

2. The method of claim 1, wherein the non-polar polymeric block comprises a non-polar polymeric hydrocarbon.

3. The method of claim 1, wherein the polar polymeric block comprises a polar polymeric hydrocarbon comprising an oxygen-containing polar functional group, a nitrogen-containing polar functional group, or a combination thereof.

4. The method of claim 1, wherein the block copolymer is selected from the group consisting of polystyrene-b-polymethylmethacrylate (PS-b-PMMA), polystyrene-b-polyvinylpyridine (PS-b-PVP or PS-b-P4VP for a 4-vinyl pyridine block), polybutadiene-polybutylmethacrylate, polybutadiene-polydimethylsiloxane, polybutadiene-b-polymethylmethacrylate, polybutadiene-b-polyvinylpyridine, polybutadiene-b-polyvinylpyridine, polyethyleneoxide-b-polyisoprene, polyethyleneoxide-b-polybutadiene, polyethyleneoxide-b-polystyrene, polyethylene-b-polyvinylpyridine, polyisoprene-b-polymethylmethacrylate, polyisoprene-b-polyvinylpyridine, polyisobutylene-b-polybutylmethacrylate, polyisobutylene-b-polydimethoxysiloxane, polyisobutylene-b-polymethylmethacrylate, polyisobutylene-b-polyvinylpyridine, polyethylene-b-polymethylmethacrylate, polystyrene-b-polybutylacrylate, polystyrene-b-polybutylmethacrylate, polystyrene-b-polydimethoxysiloxane, polystyrene-b-lactic acid, and combinations thereof.

5. The method of claim 1, wherein:
   the polar polymeric block is present in the block copolymer in an amount ranging from 10 to 90 wt. %; and
   the non-polar polymeric block is present in the block copolymer in an amount ranging from 10 to 90 wt. %.

6. The method of claim 1, wherein the block copolymer has a molecular weight ranging from 20 to 500 kDa.

7. The method of claim 1, wherein the block copolymer layer as applied has a thickness ranging from 10 to 1000 nm.

8. The method of claim 1, wherein the substrate comprises a transparent material.

9. The method of claim 8, wherein the transparent material has an index of refraction ranging from 1.3 to 2.5.

10. The method of claim 8, wherein the transparent material is selected from the group consisting of fused glass, crown glass, sapphire glass, alkali-aluminosilicate plate glass, polycarbonate, poly(methyl methacrylate), plate glass, flint glass, and diamond.

11. The method of claim 8, wherein the formed porous metal oxide or metalloid oxide layer has an index of refraction ($n_c$) and a thickness ($d_c$) selected according to the following relationship:

$$n_c = (n_s n_m)^{0.5} \quad (I)$$

$$d_c = \lambda_0 / (4 n_c) \quad (II)$$

wherein:
   $n_s$ is the index of refraction of the optically transparent material of the substrate;
   $n_m$ is the index of refraction of the medium through which incident light passes before passing through the formed porous metal oxide or metalloid oxide layer and the transparent material of the substrate, $n_m$ being a selected single value in a range from 1.0 to 1.5 and corresponding to a medium selected from air and water;
   $\lambda_0$ is an incident wavelength to be fully transmitted through the porous metal oxide or metalloid oxide layer and the transparent material of the substrate, $\lambda_0$ being a selected single wavelength in a range from 400 nm to 700 nm or 700 nm to 1000 nm;
   the index of refraction ($n_c$) of the porous metal oxide or metalloid oxide layer is within ±0.03 of the value of $n_s$ specified by equation (I); and
   the thickness ($d_c$) of the porous metal oxide or metalloid oxide layer is within ±10% of the value of $d_c$ specified by equation (II).

12. The method of claim 8, comprising performing steps (a)-(d) at least twice in succession for form at least two porous metal oxide or metalloid oxide layers.

13. The method of claim 12, wherein:
   (i) a first porous metal oxide or metalloid oxide layer formed adjacent to the transparent material substrate has an index of refraction within ±0.03 of the index of refraction of the transparent material substrate; and
   (ii) an outer porous metal oxide or metalloid oxide layer formed has an index of refraction within ±0.15 of the index of refraction of a selected medium external to the layered substrate;
   wherein the medium external to the layered substrate comprises air or water.

14. The method of claim 12, wherein the at least two porous metal oxide or metalloid oxide layers comprise a first metal oxide or metalloid oxide layer and a second metal oxide or metalloid oxide layer such that
   (i) the first metal oxide or metalloid oxide layer is proximal to the substrate relative to the second metal oxide or metalloid oxide layer and has a first refractive index value; and
   (ii) the second metal oxide or metalloid oxide layer is distal to the substrate relative to the first metal oxide or metalloid oxide layer and has a second refractive index value;
wherein the first refractive index value is between an index of refraction value of the substrate and the second refractive index value.

15. The method of claim 14, wherein the second refractive index value is between the first refractive index value and an index of refraction value of a medium external to the layered substrate, and wherein the medium external to the layered substrate comprises air or water.

16. The method of claim 15, wherein the index of refraction value of the substrate is greater than the index of refraction value of the medium external to the layered substrate.

17. The method of claim 1, wherein the solvent comprises one or more of ethanol, methanol, propanol, acetic acid, tetrahydrofuran, acetone, thioacetone, acetonitrile, ethyl acetate, methyl ethyl ketone, dimethylformamide (DMF), diethyl carbonate (DEC), toluene, benzene, methoxybenzene, chloroform, chlorobenzene, and dichloromethane.

18. The method of claim 1, comprising:
   swelling the block copolymer layer with the solvent for a time ranging from 10 to 600 minutes; and
   swelling the block copolymer layer with the solvent at a temperature ranging from 70° C. to 120° C.

19. The method of claim 1, wherein the block copolymer layer thickness after swelling relative to the block copolymer layer thickness prior to swelling ranges from 1.5 to 3.

20. The method of claim 1, wherein depositing the metal oxide or metalloid oxide layer comprises performing atomic layer deposition (ALD) (i) to selectively deposit a first precursor on polar polymeric blocks of the block copolymer layer in a first deposition half-cycle, and (ii) to react the deposited first precursor with a second precursor in a second subsequent deposition half-cycle, thereby forming the metal oxide or metalloid oxide layer.

21. The method of claim 1, wherein depositing the metal oxide or metalloid oxide layer comprises performing a plurality of deposition cycles.

22. The method of claim 1, wherein the metal oxide or metalloid oxide layer has a thickness substantially the same as that of the block copolymer layer thickness after swelling.

23. The method of claim 1, wherein the metal oxide or metalloid oxide is selected from the group consisting of alumina ($Al_2O_3$), silica ($SiO_2$), titanium dioxide ($TiO_2$), zinc oxide (ZnO), hafnium dioxide ($HfO_2$), yttrium oxide ($Y_2O_3$), and combinations thereof.

24. The method of claim 1, wherein removing the block copolymer layer from the substrate comprises performing thermal annealing.

25. The method of claim 1, wherein the formed porous metal oxide or metalloid oxide layer has a thickness ranging from 100 to 1000 nm.

26. The method of claim 1, wherein the formed porous metal oxide or metalloid oxide layer has a porosity ranging from 70 to 90 wt. %.

27. The method of claim 1, wherein the formed porous metal oxide or metalloid oxide layer has an index of refraction value 0.3-0.5 less than a corresponding index of refraction for a bulk metal oxide or metalloid oxide material.

28. The method of claim 1, wherein the formed porous metal oxide or metalloid oxide layer has an index of refraction ranging from 1.0 to 2.5.

29. The method of claim 1, wherein in step (b), the block copolymer is immersed in the liquid solvent at a temperature ranging from 55° C. to 120° C. for at least about 1 hour.

30. The method of claim 1, wherein the liquid solvent consists of ethanol, methanol, propanol, acetic acid, tetrahydrofuran, acetone, thioacetone, acetonitrile, ethyl acetate, methyl ethyl ketone, dimethylformamide, diethyl carbonate, toluene, benzene, methoxybenzene, chloroform, chlorobenzene, dichloromethane, and a combination thereof.

* * * * *